United States Patent [19]
Takeuchi et al.

[11] Patent Number: 5,852,337
[45] Date of Patent: Dec. 22, 1998

[54] PIEZOELECTRIC FILM-TYPE ELEMENT

[75] Inventors: Yukihisa Takeuchi, Nishikamo-gun; Koji Kimura, Nagoya; Masao Takahashi, Kuwana, all of Japan

[73] Assignee: NGK Insulators, Ltd., Japan

[21] Appl. No.: 863,723

[22] Filed: May 27, 1997

[30] Foreign Application Priority Data

May 27, 1996 [JP] Japan ................................ 8-132045
May 9, 1997 [JP] Japan ................................ 9-119598

[51] Int. Cl.⁶ .................................................. H01L 41/08
[52] U.S. Cl. ............................................ 310/328; 310/324
[58] Field of Search .................................. 310/324, 328, 310/358

[56] References Cited

U.S. PATENT DOCUMENTS

| | | | |
|---|---|---|---|
| 2,540,194 | 2/1951 | Ellett | 346/1.1 |
| 4,481,807 | 11/1984 | Van Basshuysen et al. | 73/35 |
| 4,702,418 | 10/1987 | Carter et al. | 239/101 |
| 4,825,227 | 4/1989 | Fischbeck et al. | 346/1.1 |
| 5,210,455 | 5/1993 | Takeuchi et al. | 310/328 |
| 5,376,856 | 12/1994 | Takeuchi et al. | 310/328 |
| 5,475,279 | 12/1995 | Takeuchi et al. | 310/331 |
| 5,594,292 | 1/1997 | Takeuchi et al. | 310/324 |
| 5,596,239 | 1/1997 | Dydyk | 310/311 |
| 5,600,197 | 2/1997 | Takeuchi et al. | 310/328 |
| 5,617,127 | 4/1997 | Takeuchi et al. | 310/328 |
| 5,691,594 | 11/1997 | Takeuchi et al. | 310/330 |
| 5,692,279 | 12/1997 | Mang et al. | 310/312 |
| 5,698,931 | 12/1997 | Shibata et al. | 310/338 |

FOREIGN PATENT DOCUMENTS

| | | | |
|---|---|---|---|
| 5-49270 | of 0000 | Japan | H02N 2/00 |
| 58-121817 | 7/1983 | Japan | 310/324 |
| 58-153412 | 9/1983 | Japan | 310/324 |
| 59-23613 | 2/1984 | Japan | 310/324 |
| 59-86916 | 5/1984 | Japan | 310/324 |
| 3-128681 | 5/1991 | Japan | H02N 2/00 |
| WO 89/08240 | 9/1989 | WIPO | G01D 15/16 |

*Primary Examiner*—Thomas M. Dougherty
*Attorney, Agent, or Firm*—Parkhurst & Wendel

[57] ABSTRACT

A piezoelectric film-type element includes a piezoelectric operating layer constructed by successively and integrally forming and stacking, on a ceramic substrate, a single flat film-shaped lower electrode, a piezoelectric layer, and an upper electrode comprising a plurality of alternately arranged strip electrodes. The lower electrode is designated as a first electrode, and the upper electrode is designated as a second electrode. A first piezoelectric operating means is constructed by the first and second electrodes and the piezoelectric layer, while a second piezoelectric operating means is constructed by the second electrode and the piezoelectric layer. No other piezoelectric layer is stacked on the foregoing piezoelectric operating layer. Operating characteristics of the piezoelectric operating section can be sufficiently utilized by constructing the piezoelectric film-type element as described above. Thus it is possible to provide a piezoelectric film-type element which has excellent performance, has a compact size and can operate at a low voltage.

14 Claims, 15 Drawing Sheets

*1: Displacement available by longitudinal effect

*2: Displacement available by transverse effect

*3: Displacement available by combination of longitudinal and transverse effects F I G. 6A
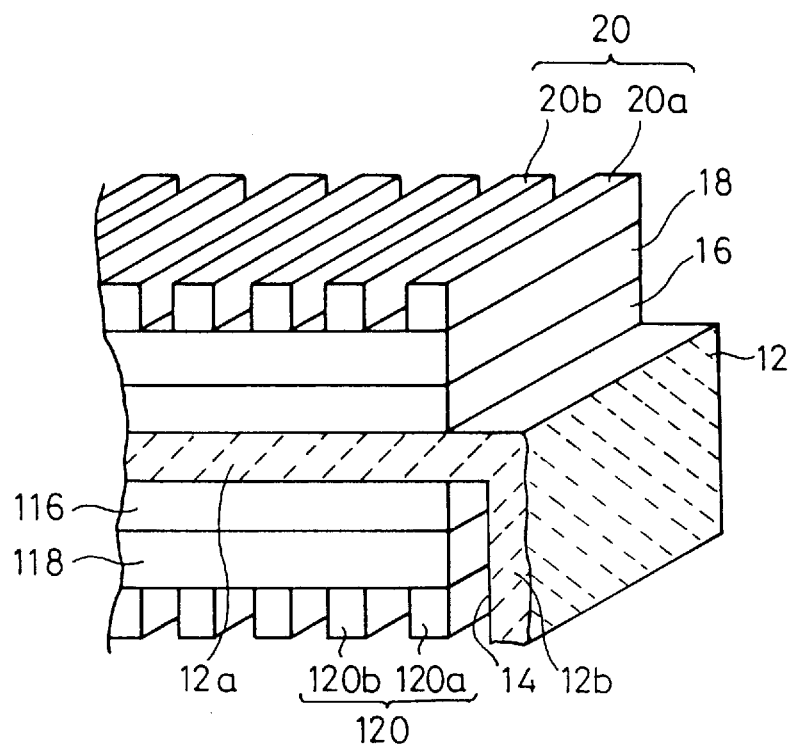
F I G. 6B
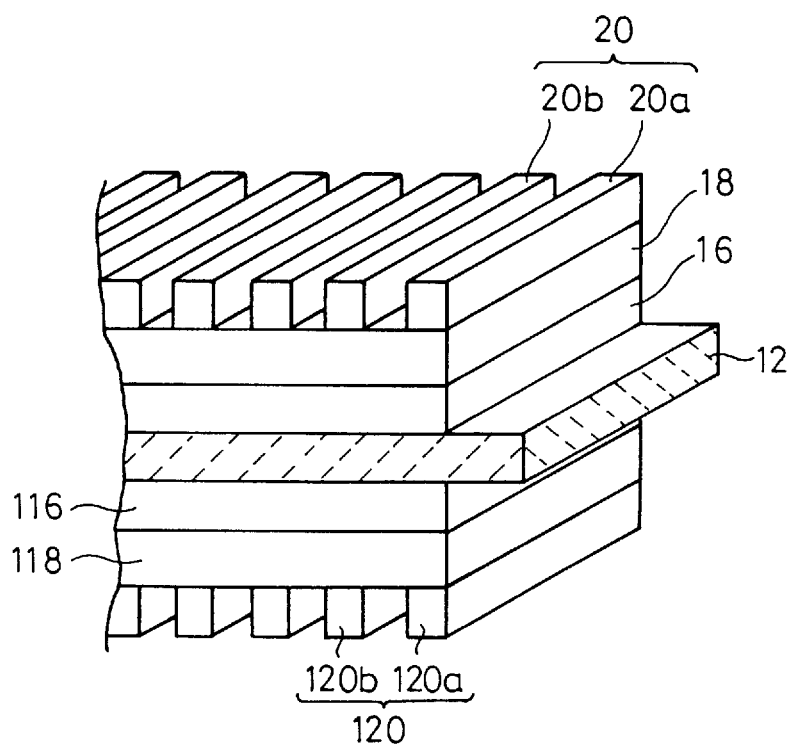

F I G.15
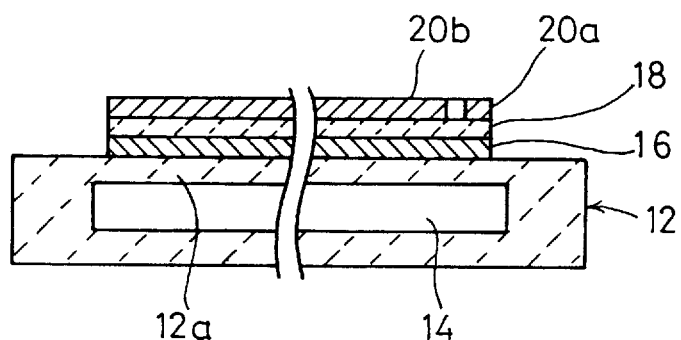

PIEZOELECTRIC FILM-TYPE ELEMENT

BACKGROUND OF THE INVENTION

1. Field of the Invention

The present invention relates to improvement in piezoelectric film-type element. In particular, the present invention relates to a mechanism or a structure capable of improving operating characteristics of an element for converting electric energy into mechanical energy, i e., for converting electric energy into mechanical displacement, force, or vibration, or for performing conversion reversely from the latter to the former.

2. Description of the Related Art

Recently, it has been demanded, in the fields of optics, precision manufacturing, etc., to use a displacement element for adjusting the optical path length or the position on the order of submicron, and a detecting element for detecting minute displacement after converting it into an electric variation.

In order to respond to such a demand, there have been developed piezoelectric/electrostrictive elements to be used for actuators which utilize occurrence of displacement based on the reverse or inverse piezoelectric effect caused when an electric field is applied to a piezoelectric material such as a ferroelectric substance, and for sensors which utilize a phenomenon (piezoelectric effect) reverse to the foregoing.

Among them, as for speakers, for example, those preferably adopted as such a piezoelectric/electrostrictive element structure include, for example, those of the unimorph type which have been hitherto known.

In such a state of art, the present applicant has been also previously proposed piezoelectric (/electrostrictive) film-type elements made of a ceramic material, which can be preferably used for various applications, as described, for example, in Japanese Laid-Open Patent Publication Nos; 3-128681 and 5-49270.

The previously proposed piezoelectric film-type elements have the following structure. Namely, the element comprises a ceramic substrate having at least one window (hollow space) and including a thin-walled diaphragm section provided integrally to cover and close the window so that at least one thin-walled wall section is formed. The element further includes, on an outer surface of the diaphragm section of the ceramic substrate, a film-shaped piezoelectric operating layer comprising a combination of a lower electrode, a piezoelectric layer, and an upper electrode, in which the piezoelectric operating layer is integrally formed and stacked in accordance with a film-forming method.

The piezoelectric film-type element is operated to cause, for example, displacement, force, and vibration by utilizing the transverse effect of the piezoelectric effect (especially the electric field-induced strain), i.e., by utilizing the strain brought about in a direction perpendicular to a direction of the electric field, in accordance with application of an electric power between the upper electrode and the lower electrode.

The piezoelectric film-type element has the following excellent features. Namely, it serves as a compact and inexpensive electromechanical conversion element with high reliability to provide large displacement at a low operating voltage, in which the response speed is quick, and the generated force is large. It is acknowledged that such a piezoelectric film-type element is useful to be used, for example, as a constituting component of actuators, filters, displays, and sensors.

On the other hand, U.S. Pat. No. 2,540,194 discloses, in its specification, a piezoelectric actuator having a structure in which strip electrodes extending in a widthwise direction of a piezoelectric layer is provided in a stripe configuration in a longitudinal direction of the piezoelectric layer. The strip electrodes are separated from each other by a predetermined spacing distance on a surface of the piezoelectric layer having a longitudinal plate shape with a predetermined thickness.

This actuator is operated as follows. Namely, different voltages are alternately applied to the strip electrodes arranged in the stripe configuration as described above so that predetermined electric fields are applied between the strip electrodes. Thus displacement, force, or vibration is allowed to occur, or conversion reverse thereto is caused, by utilizing the longitudinal effect of the piezoelectric effect (the electric field-induced strain) brought about in portions of the piezoelectric layer existing between the strip electrodes, i.e., by utilizing the effect in a direction parallel to the direction of the electric field.

However, any of the conventional piezoelectric elements or the piezoelectric film-type elements merely utilizes only one of the transverse effect (effect in the direction perpendicular to the electric field) of the piezoelectric effect brought about by the piezoelectric operating layer comprising the piezoelectric layer and the two electrodes provided on its both sides in the thickness direction, and the longitudinal effect (effect in the direction parallel to the direction of the electric field) of the piezoelectric effect brought about by the piezoelectric operating layer. comprising the piezoelectric layer and the strip electrodes provided on one side thereof. It is extremely advantageous to sufficiently exhibit and improve the operating characteristics of the piezoelectric operating layer of such an element, from a viewpoint to achieve an element having a compact size, and for the purpose of enhancing the function of the element.

Japanese Laid-Open Patent Publication No. 5-49270 described above also discloses, in its drawing (FIG. 14), a piezoelectric actuator in which strip electrodes and a piezoelectric layer are formed and stacked successively and integrally on a ceramic substrate to construct a piezoelectric operating layer (driving section), and a film-shaped electrode, a piezoelectric layer, and a film-shaped electrode are formed and stacked successively thereon to integrally construct another piezoelectric operating layer (driving section).

However, in every sense in this prior art, the disclosed structure is merely obtained by simply overlapping and stacking the two piezoelectric operating sections (driving sections) with each other to be combined into one unit. Therefore, the two piezoelectric layers are necessarily required as a matter of course, and it is inevitable for the piezoelectric layers to have an extremely thick entire thickness. When one of the piezoelectric operating layers is operated, its operation is restrained or inhibited due to the presence of the other piezoelectric operating layer. Accordingly, the conventional technique inherently involves problems. Namely, for example, it is difficult to sufficiently exhibit the operating characteristics of the respective piezoelectric operating layers.

SUMMARY OF THE INVENTION

The present invention has been made on the background of the foregoing circumstances, an object of which is to provide a piezoelectric film-type element having excellent function, capable of achieving a compact size and being operated at a low voltage, making it possible to sufficiently utilize operating characteristics of a piezoelectric operating layer.

In order to achieve the object as described above, the present invention lies in a piezoelectric film-type element having a structure including a ceramic substrate, and a film-shaped piezoelectric operating layer comprising a single piezoelectric layer provided in a layered configuration over at least a part of at least one surface of the ceramic substrate, and first and second electrodes arranged integrally on both sides in a thickness direction of the piezoelectric layer respectively, wherein no other piezoelectric operating layer is stacked on the piezoelectric operating layer; the piezoelectric film-type element comprising the first electrode which is formed by using a single flat film-shaped electrode layer; the second electrode, at least a part of which is formed and constructed by using a plurality of strip electrodes; a first piezoelectric operating means constructed by the first and second electrodes and the piezoelectric layer; and a second piezoelectric operating means constructed by the piezoelectric layer and the plurality of strip electrodes of the second electrode.

In the piezoelectric film-type element according to the present invention constructed as described above, the transverse effect of the piezoelectric effect is effectively expressed by the first piezoelectric operating means, and the longitudinal effect of the piezoelectric effect is advantageously expressed by the second piezoelectric operating means.

Therefore, when the foregoing element is applied, for example, to actuators and vibrators, it is possible to obtain displacement and vibration in both upper and lower directions with respect to the ceramic substrate as a diaphragm by utilizing the transverse effect of the electric field-induced strain caused by the application of the electric field between the electrodes (first and second electrodes) which interpose the piezoelectric layer in the thickness direction and the longitudinal effect of the electric field-induced strain caused by the application of the electric field between the plurality of strip electrodes (second electrode) which interpose the piezoelectric layer in the planar direction. Further, it is possible to utilize a combined amplitude of displacement and a combined amplitude of vibration obtained by combining those provided by the longitudinal effect and the transverse effect. Accordingly, it is possible to obtain remarkably improved displacement characteristics and vibration characteristics. In other words, the foregoing phrase means that certain displacement equivalent to that obtained by the conventional element can be obtained by using a lower operating voltage.

As for the conventional piezoelectric element, i.e., the element to utilize one piezoelectric effect by using one piezoelectric layer, an attempt has been made to achieve an operation equivalent to that obtained by the present invention, by applying an electric field in a direction opposite to a direction of polarization of a piezoelectric layer to provide the ceramic substrate as a diaphragm with displacement in both upper and lower directions, in order to increase displacement and vibration amplitudes. However, the electric field, which is applied in the direction opposite to the direction of polarization, is limited by the polarization-inverting electric field (also referred to as "critical electric field" or "coercive electric field"). Therefore, in the case of the conventional technique, it is consequently difficult to obtain any sufficient displacement and generated force. Moreover, a problem also remains in the conventional technique, concerning stability of displacement and vibration because the electric field, which is approximate to the polarization-inverting electric field, is applied.

However, in principle, the piezoelectric element according to the present invention is not limited to the polarization-inverting electric field described above. The electrodes, to which the electric field is applied, are selectively operated by applying the electric power. Accordingly, the reliability is high, and stable operation is achieved.

Especially, in the present invention, it is desirable to form the piezoelectric layer by using a piezoelectric material having a polarization-inverting electric field (coercive electric field) of not more than 10 kV/cm. When the piezoelectric layer composed of such a piezoelectric material is used, polarization can be achieved relatively easily and instantly upon application of the electric field. Therefore, it is possible to effectively exhibit the feature of the present invention. Further, a polarizing process, which would be otherwise performed before the use of the element, can be omitted by selecting the piezoelectric material for forming the piezoelectric layer. It is a matter of course that such an effect can be equivalently utilized, for example, for sounding bodies and display elements, in addition to illustrated actuators and vibrators.

On the other hand, when the structure of the piezoelectric film-type element according to the present invention is applied to a filter or the like, an exciting section and a receiving section can be constructed only by making selection from the electrodes while commonly using one piezoelectric layer. Accordingly, the structure is advantageous to provide the element having a compact size. Further, the element of the present invention can be equivalently constructed and utilized as a transformer.

As described above, the characteristics of the piezoelectric layer, which have not been utilized in the conventional element, can be skillfully brought out by adopting the structure of the piezoelectric film-type element according to the present invention, making it possible to further miniaturize the size, reduce the electric power consumption, and improve the function, as compared with the conventional element having an equivalent function.

In a preferred embodiment of the piezoelectric film-type element according to the present invention, a structure is adopted, the ceramic substrate is formed as a thin-walled diaphragm section, and the piezoelectric operating layer is integrally formed on an outer surface of the diaphragm section.

In another preferred embodiment of the piezoelectric film-type element according to the present invention, a structure is adopted, in which the ceramic substrate is provided with at least one hollow space, a portion of the ceramic substrate to give a wall section for comparting the hollow space from the outside is formed as a thin-walled diaphragm section, and the piezoelectric operating layer is integrally formed on an outer surface of the diaphragm section.

In the foregoing preferred embodiments, it is preferable that the plurality of strip electrodes are divided into two different sets each comprising alternate strip electrodes so that each of the alternate strip electrodes is connected to one another at one of both ends in a longitudinal direction respectively to construct two comb-shaped electrodes. Preferably, the ceramic substrate is composed of a material containing, as a major component, completely stabilized or partially stabilized zirconium oxide.

In order to obtain large displacement with a relatively low operating voltage according to the present invention constructed as described above, it is desirable that the piezoeletric layer has a thickness of not more than 100 µm. It is preferable that the piezoelectric operating layer has a thickness of not more than 150 µm.

When the second piezoelectric operating means is operated, it is preferable to consider the electric field in the vicinity of the lower conductor film (first electrode) which is not utilized as an electrode. Accordingly, it is desirable to satisfy $0.3 \leq X/Y \leq 6$ provided that the thickness of the piezoelectric layer is X, and the distance between the plurality of strip electrodes is Y.

In order to obtain high speed response and large displacement of the piezoelectric film-type element according to the present invention constructed as described above, it is preferable that the diaphragm section has a thickness of not more than 50 µm. Further, in order to improve the operating characteristics of the piezoelectric operating layer and obtain large displacement and large generated force when the element is used, for example, as a detecting section of an actuator, it is desirable that crystals for constructing at least the diaphragm section of the ceramic substrate have an average grain size of 0.1 to 2 µm.

It is a matter of course that the piezoelectric effect used in the present invention includes not only the piezoelectric effect but also the inverse piezoelectric effect and the electrostrictive effect, and the piezoelectric operating means, which is an operating means based on the use of the effects, includes electrostrictive operating means as well.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 6A shows a partial perspective view illustrating a piezoelectric film-type element having a bi-morph type structure (based on the use of a ceramic substrate having a cavity structure) according to a fourth embodiment.

FIG. 6B shows a partial perspective view illustrating a piezoelectric film-type element having a bi-morph type structure (based on the use of a sheet of plate-shaped ceramic substrate) according to a fourth embodiment.

FIG. 15 shows a cross-sectional view illustrating a modified embodiment of the piezoelectric film-type element according to the present invention, especially illustrating, as an example, a film-shaped piezoelectric operating section formed only on a thin-walled section.

DESCRIPTION OF THE PREFERRED EMBODIMENTS

As described above, the present invention is constructed by providing a combination of a single piezoelectric layer formed on a ceramic substrate, and two kinds of different electrodes (first and second electrodes) so that the operating characteristics are improved and the function is enhanced by making it possible to utilize both of respective functions and characteristics realized by applying different electric fields to the single piezoelectric layer.

Illustrative embodiments including representative and individual embodiments, in which the piezoelectric film-type element according to the present invention is applied, for example, as a displacement element (hereinafter simply referred to as "piezoelectric film-type element according to the representative embodiment" or "piezoelectric film-type element according to the present invention"), will be explained below with reference to FIGS. 1 to 15.

Figure 1A:
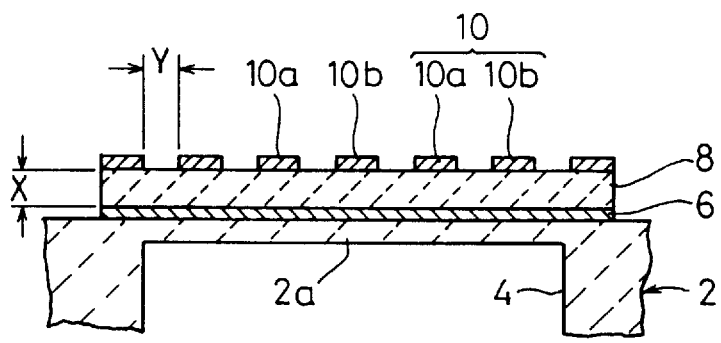
FIG. 1A schematically shows a cross-sectional view illustrating, as an example, a representative embodiment which represents application of a piezoelectric film-type element according to the present invention as a displacement element (hereinafter referred to as "piezoelectric film-type element according to the representative embodiment").

As shown in FIG. 1A, the piezoelectric film-type element according to the representative embodiment is provided with a ceramic substrate 2. The ceramic substrate 2 has a hollow space 4 therein. A thin-walled portion of the ceramic substrate 2, which constructs a wall section for comparting the hollow space 4 from the outside, is designated as a thin-walled section 2a which functions as a diaphragm. A lower electrode 6, a piezoelectric layer 8, and an upper electrode 10 are formed and stacked successively and integrally on an outer surface of the thin-walled section 2a. Thus a film-shaped piezoelectric operating layer is constructed. The lower electrode 6 is formed to have a single film configuration. The upper electrode 10 comprises a plurality of strip electrodes 10a, 10b. Therefore, in this embodiment, the lower electrode 6 corresponds to the first electrode, and the upper electrode 10 corresponds to the second electrode.

Figure 1B:
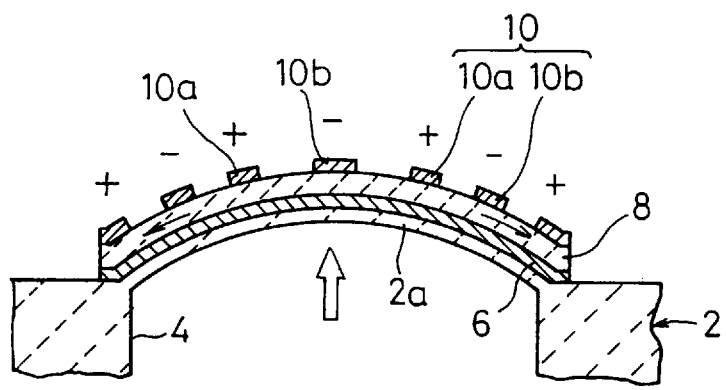
FIG. 1B schematically shows a cross-sectional view illustrating a state in which a second piezoelectric operating means of the piezoelectric film-type element according to the representative embodiment is operated.
Figure 2A:
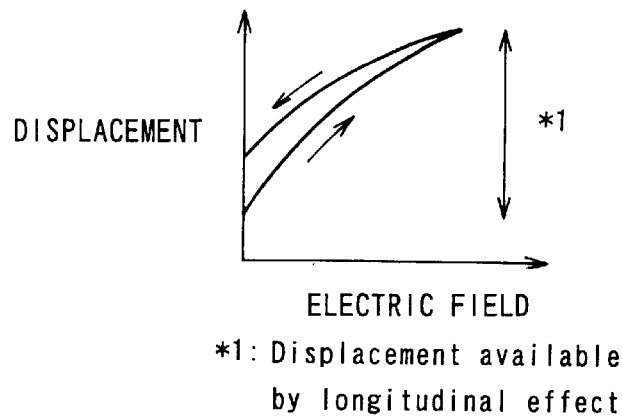
FIG. 2A shows a graph illustrating a relationship between the displacement and the electric field, obtained in a state in which the second piezoelectric operating means of the piezoelectric film-type element according to the representative embodiment is operated.

As shown in FIG. 1B, an electric power is applied to the piezoelectric film-type element according to the representative embodiment so that the plurality of strip electrodes 10a, 10b for constructing the upper electrode 10 alternately serve as positive and negative electrodes. When a predetermined electric field is applied between the plurality of strip electrodes 10a, 10b, the thin-walled section 2a is displaced in a first direction (direction in which the strip electrodes 10a 10b face the free space, see an arrow shown in FIG. 1B) in accordance with the piezoelectric effect, i.e., the longitudinal effect of the electric field-induced strain in this embodiment. FIG. 2A shows a relationship between the displacement amount and the electric field provided by the longitudinal effect.

Figure 1C:
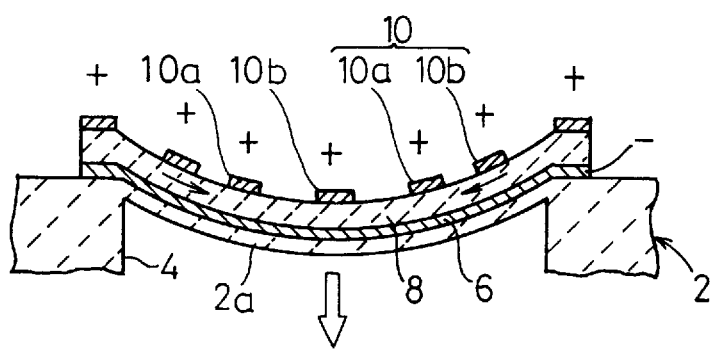
FIG. 1C schematically shows a cross-sectional view illustrating a state in which a first piezoelectric operating means of the piezoelectric film-type element according to the representative embodiment is operated.
Figure 2B:
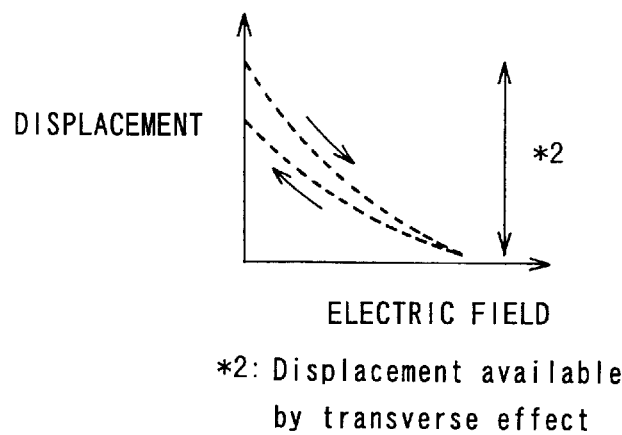
FIG. 2B shows a graph illustrating a relationship between the displacement and the electric field, obtained in a state in which the first piezoelectric operating means of the piezoelectric film-type element according to the representative embodiment is operated.

On the other hand, as shown in FIG. 1C, when the upper electrode 10 (all or selected ones of the strip electrodes 10a, 10b) is allowed to have an identical polarity, and an electric field is applied between the upper electrode 10 and the lower electrode 6, then the thin-walled section 2a is displaced in a second direction (direction opposite to the direction in which the strip electrodes 10a 10b face the free space, see an arrow shown in FIG. 1C) in accordance with the piezoelectric effect, i.e., the transverse effect of the electric field-induced strain in this embodiment. FIG. 2B shows a relationship between the displacement amount and the electric field provided by the transverse effect.

As described above, the first piezoelectric operating means is constructed by the lower electrode 6, the piezoelectric layer 8, and the upper electrode 10 in the case of the state shown in FIG. 1C. On the other hand, the second piezoelectric operating means is constructed by the piezoelectric layer 8 and the plurality of strip electrodes 10a, 10b for constructing the upper electrode in the case of the sate shown in FIG. 1B.

Therefore, the displacement or the force can be arbitrarily generated in any of the first and second directions by using the single piezoelectric layer 8 by controlling with predetermined cycles the application of the electric power or the application of the voltage to the upper electrode 10 and the lower electrode 6. Namely, for example, the displacement and the force can be expressed in a region obtained by combining the displacements shown in FIGS. 2A and 2B. This effect has not been obtained by using the conventional piezoelectric film-type element.

Figure 2C:
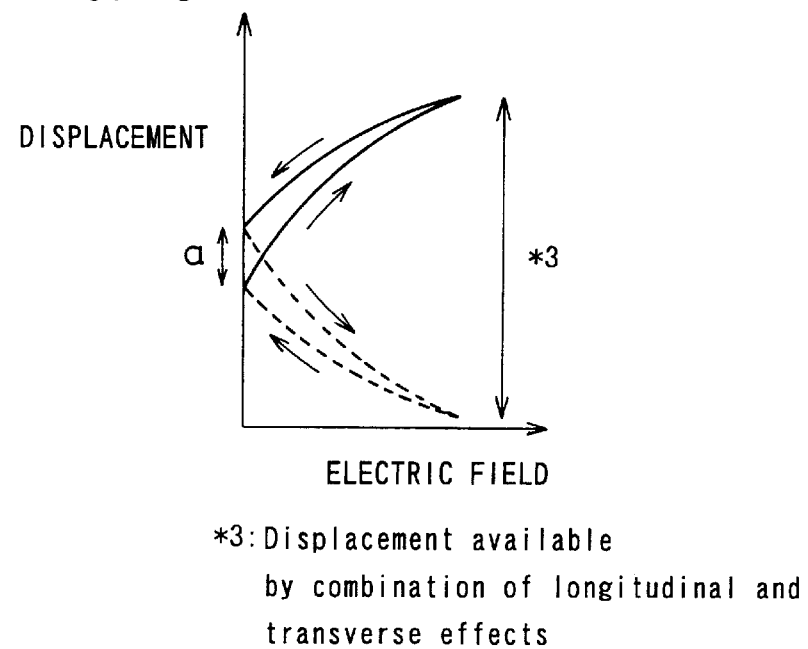
FIG. 2C shows a graph illustrating a relationship between the displacement and the electric field, obtained in a state in which both of the first and second piezoelectric operating means of the piezoelectric film-type element according to the representative embodiment are operated.

When a piezoelectric material is used, generally a residual strain occurs on account of the polarizing action in relation to the displacement region (a) shown in FIG. 2C. Accordingly, such a residual strain can be utilized as displacement by rotating the direction of polarization by 90° by performing switching. As described above, in the case of displacement, for example, combined displacement of those obtained by the longitudinal and transverse effects is obtained by utilizing both of the displacement, force, and vibration brought about by the longitudinal effect and the displacement, force, and vibration brought about by the transverse effect exerted on the single piezoelectric layer 8. It is possible to remarkably improve the characteristics as compared with those based on the conventional technique in which only any one of the longitudinal and transverse effects is utilized. Further, the piezoelectric film-type element according to the present invention can be constructed as a memory device by utilizing the displacement region (a) from a viewpoint of maintenance of a displacement state.

Next, several embodiments (individual embodiments) concerning representative structures of the piezoelectric film-type element according to the present invention will be explained with reference to FIG. 3A and the following drawings. In the several embodiments shown in FIG. 3A and the following drawings, emphasized expressions are made for thickness, length, width and so on, in order to easily understand stacked structures of respective layers. It should be understood that these expressions do not correspond to actual dimensions.

Figure 3A:
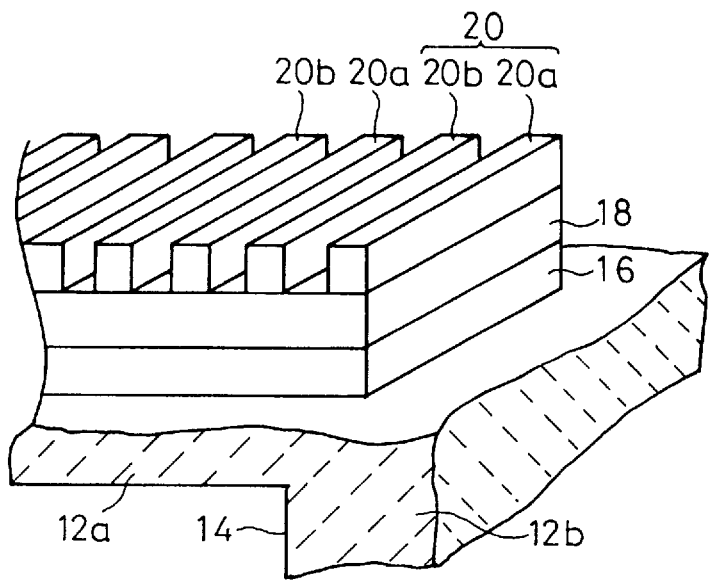
FIG. 3A shows a partial perspective view illustrating a piezoelectric film-type element (based on the use of a ceramic substrate having a cavity structure) according to a first embodiment.

At first, a piezoelectric film-type element according to a first embodiment shown in FIG. 3A comprises a lower electrode 16 having a single flat film-shaped configuration, a piezoelectric layer 18 also having a single flat film-shaped configuration, and a film-shaped upper electrode 20 composed of a plurality of strip electrodes 20a, 20b, which are formed and stacked successively and integrally on one surface of a thin-walled ceramic substrate 12 formed to have a longitudinal flat plate-shaped configuration with a predetermined width, in the same manner as the embodiment shown in FIG. 1A. Thus a film-shaped piezoelectric operating layer is constructed.

The ceramic substrate 12 has a hollow space 14 therein. A thin-walled portion of the ceramic substrate 12, which constructs a wall section for comparting the hollow space 14 from the outside, is formed as a thin-walled section 12a to serve as a diaphragm section. A film-shaped piezoelectric operating layer is integrally formed on an outer surface of the thin-walled section 12a. The piezoelectric operating layer is constructed by successively stacking and integrating a lower electrode 16, a piezoelectric layer 18, and an upper electrode 20 (strip electrodes 20a, 20b) so that the piezoelectric operating layer extends in a spanning manner between thick-walled sections 12b, 12b of the ceramic substrate 12, located on both sides of the hollow space 14.

The plurality of strip electrodes 20a, 20b, which construct the upper electrode 20, are alternately arranged in a stripe configuration and separated from each other by a predetermined spacing distance. Neither additional piezoelectric layer nor additional piezoelectric operating layer is stacked at all on the upper electrode 20.

Accordingly, the piezoelectric film-type element according to the first embodiment shown in FIG. 3A is constructed as follows. Namely, a first piezoelectric operating means, which utilizes the transverse effect of the piezoelectric effect, is constructed by the lower electrode 16, the piezoelectric layer 18, and the upper electrode 20. A second piezoelectric operating means, which utilizes the longitudinal effect of the piezoelectric effect, is constructed by the piezoelectric layer 18 and the plurality of the strip electrodes 20a, 20b of the upper electrode 20. According to this arrangement, the two piezoelectric effects can be exhibited by utilizing the single piezoelectric layer 18. Thus it is possible to realize improvement in characteristics of the piezoelectric film-type element.

Figure 3B:
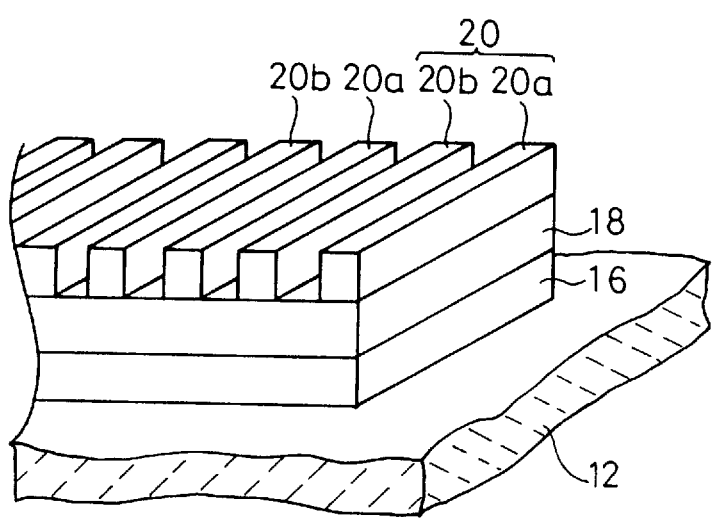
FIG. 3B shows a partial perspective view illustrating a piezoelectric film-type element (based on the use of a sheet of plate-shaped ceramic substrate) according to a first embodiment.

Alternatively, as shown in FIG. 3B, the film-shaped piezoelectric operating section may be formed, for example, on a sheet of plate-shaped ceramic substrate 12. In this arrangement, a certain function equivalent to that of the foregoing diaphragm section can be provided by supporting the plate-shaped ceramic substrate 12 by using a support member which is separately provided (not shown).

Figure 4A:
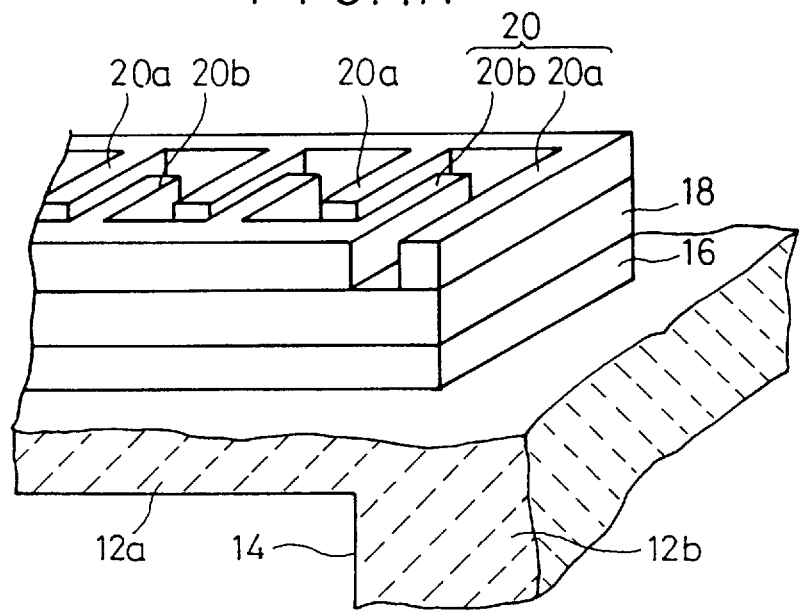
FIG. 4A Shows a partial perspective view illustrating a piezoelectric film-type element (based on the use of a ceramic substrate having a cavity structure) according to a second embodiment.
Figure 4B:
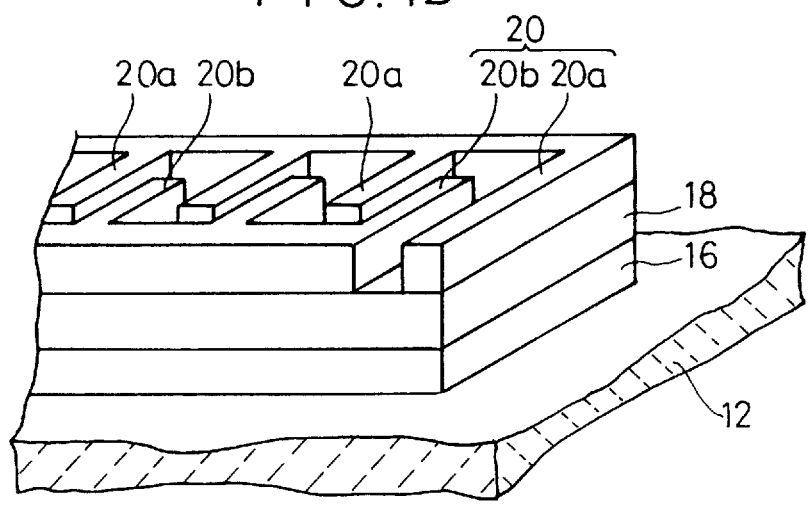
FIG. 4B shows a partial perspective view illustrating a piezoelectric film-type element (based on the use of a sheet of plate-shaped ceramic substrate) according to a second embodiment.

A piezoelectric film-type element according to a second embodiment shown in FIGS. 4A, 4B is characterized in that a plurality of strip electrodes 20a, 20b for constructing an upper electrode 20 are divided into two different sets each comprising alternate strip electrodes, and each of the alternate strip electrodes 20a, 20b is connected to one another at one of both ends in a longitudinal direction respectively so that two comb-shaped electrodes are constructed.

Namely, the first comb-shaped electrode is constructed by connecting the strip electrodes 20a arranged alternately, at the end on the identical first side in the longitudinal direction. Further, the second comb-shaped electrode is constructed by connecting the strip electrodes 20b arranged alternately with respect to the strip electrodes 20a, at the end on the second side opposite to the end on the first side for the strip electrodes 20a. Especially, for example, the following advantage is obtained by adopting such a comb-shaped electrode structure. Namely, it is possible to easily supply the electric power to the group of the plurality of strip electrodes 20a and to the other group of the plurality of strip electrodes 20b.

Figure 5A:
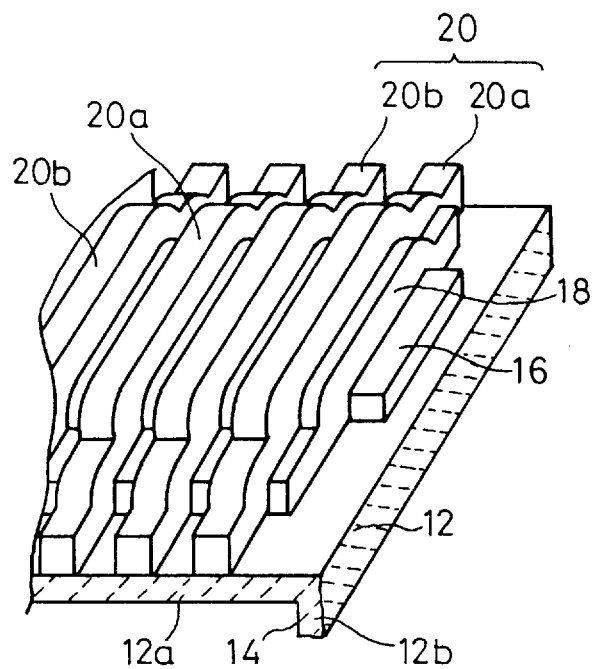
FIG. 5A shows a partial perspective view illustrating a piezoelectric film-type element (based on the use of a ceramic substrate having a cavity structure) according to a third embodiment.
Figure 5B:
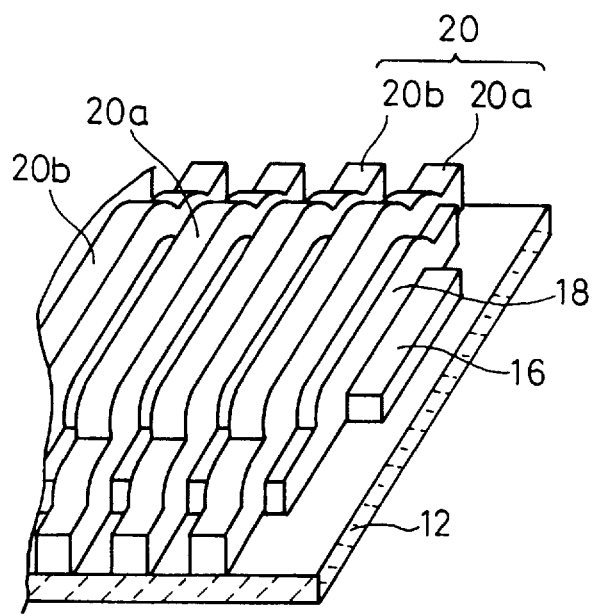
FIG. 5B shows a partial perspective view illustrating a piezoelectric film-type element (based on the use of a sheet of plate-shaped ceramic substrate) according to a third embodiment.

A piezoelectric film-type element according to a third embodiment shown in FIGS. 5A, 5B has the following feature. Namely, a lower electrode 16 is provided on a ceramic substrate 12 having a thin thickness and arranged in a longitudinal direction. A piezoelectric layer 18 is provided so that it covers the lower electrode 16 in a widthwise direction. Strip electrodes 20a, 20b, which construct an upper electrode 20, are provided so that they overlap the piezoelectric layer 18 in the widthwise direction respectively.

Namely the piezoelectric layer 18 is designed to be longer than the lower electrode 16 in the widthwise direction of the ceramic substrate 12, and the upper electrode 20 is designed to be longer than the piezoelectric layer 18 in the widthwise direction of the ceramic substrate 12. In this embodiment, the upper and lower electrodes 16, 20 can be prevented from short circuit formation if positional deviation occurs in the piezoelectric layer 18 or the upper electrode 20 (strip electrodes 20a, 20b) with respect to the lower electrode 16.

The piezoelectric film-type element according to the present invention is not limited only to the elements having the uni-morph type structures as described above, but the piezoelectric film-type element according to the present invention may be also constructed as an element having the bi-morph type structure as shown in FIGS. 6A, 6B.

Namely, in the piezoelectric film-type element concerning a fourth embodiment shown in FIGS. 6A, 6B, one piezoelectric operating layer is integrally formed on one surface of a ceramic substrate 12, which comprises a lower electrode 16, a piezoelectric layer 18, and an upper electrode 20 (strip electrodes 20a, 20b), having the same structure as that of the first embodiment (see FIGS. 3A, 3B). Another piezoelectric operating layer is also integrally formed on another surface of the ceramic substrate 12, which comprises a lower electrode 116, a piezoelectric layer 118, and an upper electrode 120 (strip electrodes 120a, 120b), having the same structure as that of the foregoing piezoelectric operating layer.

When the piezoelectric film-type element of the bi-morph type described above is operated, operating modes of the two piezoelectric operating means based on the respective piezoelectric operating layers are controlled. For example, when the piezoelectric film-type element is used as a displacement element, control is made so that any of the piezoelectric operating layers disposed on the both sides of the ceramic substrate 12 functions to cause displacement, force, or vibration in an identical direction.

Figure 7:
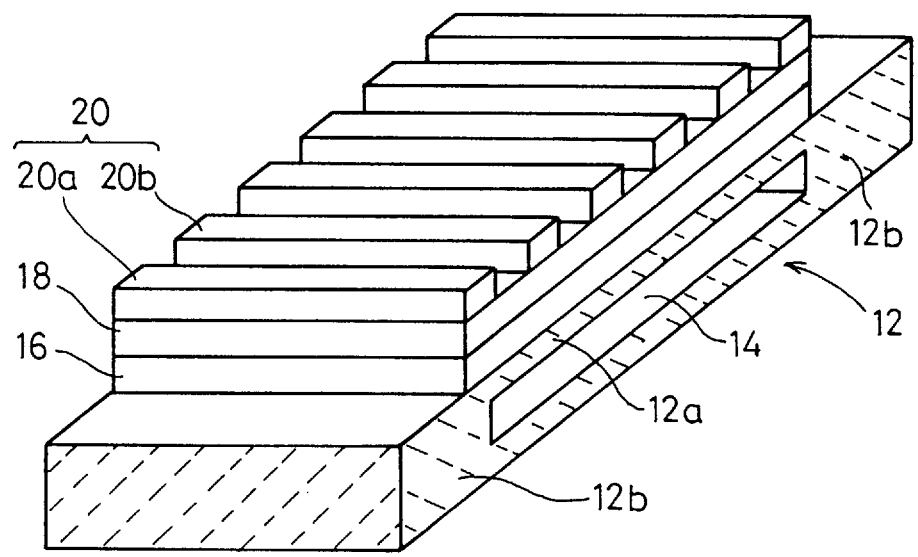
FIG. 7 shows a partial perspective view illustrating a piezoelectric film-type element (based on the use of a ceramic. substrate having a cavity structure) according to a fifth embodiment.
Figure 8:
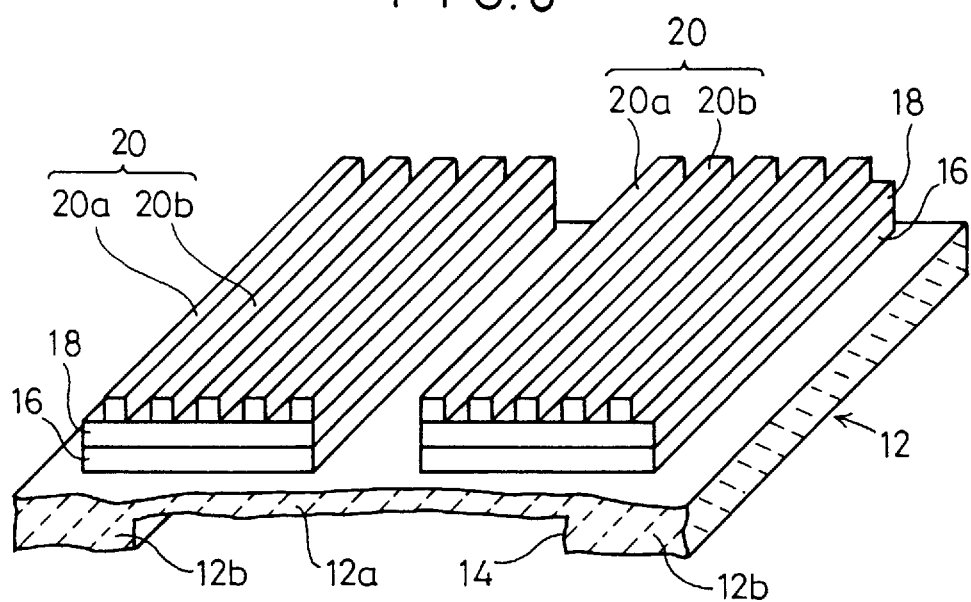
FIG. 8 shows a partial perspective view illustrating a piezoelectric film-type element (based on the use of a ceramic substrate having a cavity structure) according to a sixth embodiment.

A piezoelectric film-type element according to a fifth embodiment shown in FIG. 7 is characterized in that a ceramic substrate 12 has a cavity structure. Namely, the ceramic substrate 12 has a hollow space 14 therein. A thin-walled portion of the ceramic substrate 12, which constructs a wall section for comparting the hollow space 14 from the outside, is formed as a thin-walled section 12a to serve as a diaphragm section. A film-shaped piezoelectric operating layer, which is equivalent to that described in the embodiment shown in FIGS. 3A, 3B, is integrally formed on an outer surface of the thin-walled section 12a. The piezoelectric operating layer is constructed by successively stacking and integrating a lower electrode 16, a piezoelectric layer 18, and an upper electrode 20 (strip electrodes 20a, 20b) so that the piezoelectric operating layer extends in a spanning manner between thick-walled sections 12b, 12b of the ceramic substrate 12, located on both sides of the hollow space 14. Thus a so-called bridge beam structure (fixed beam) is provided.

A piezoelectric film-type element according to a sixth embodiment shown in FIG. 8A uses a ceramic substrate 12 having a cavity structure which is formed with a hollow space 14, comprising a thin-walled section 12a formed at a central portion in a widthwise direction, and thick-walled sections 12b, 12b located on both sides of the thin-walled section 12a. Two piezoelectric operating layers are integrally formed on the thin-walled section 12a of the ceramic substrate 12 so that ends of the two piezoelectric operating layers are located on the thick-walled sections 12b respectively.

Namely, the respective piezoelectric operating layers extend from the thick-walled sections 12b to the thin-walled section 12a of the ceramic substrate 12. In this arrangement, each of the piezoelectric operating layers is constructed by successively forming, stacking, and integrating a lower electrode 16, a piezoelectric layer 18, and an upper electrode 20 (strip electrodes 20a, 20b). The piezoelectric film-type element concerning a sixth embodiment which is different from the other embodiments. Namely, an electric power is applied to the piezoelectric film-type element according to the sixth embodiment so that the plurality of the representative embodiment so that the plurality of strip electrodes 20a, 20b for constructing the upper electrode 20 alternately serve as positive and negative electrodes. When a predetermined electric field is applied between the plurality of strip) electrodes 20a, 20b, the thin-walled section 12a is displaced in a second direction (direction opposite to the direction in which the strip electrodes 20a, 20b face the free space) in accordance with the longitudinal effect of the electric field-induced strain in this embodiment.

When the upper electrode 20 (all or selected ones of the strip electrodes 20a, 20b ) is allowed to have an identical polarity, and an electric field is applied between the upper electrode 20 and the lower electrode 16, then the thin-walled section 12a is displaced in a first direction (direction in which the strip electrodes 20a, 20b face the free space) in accordance with the transverse effect of the electric field-induced strain in this embodiment.

Figure 9:
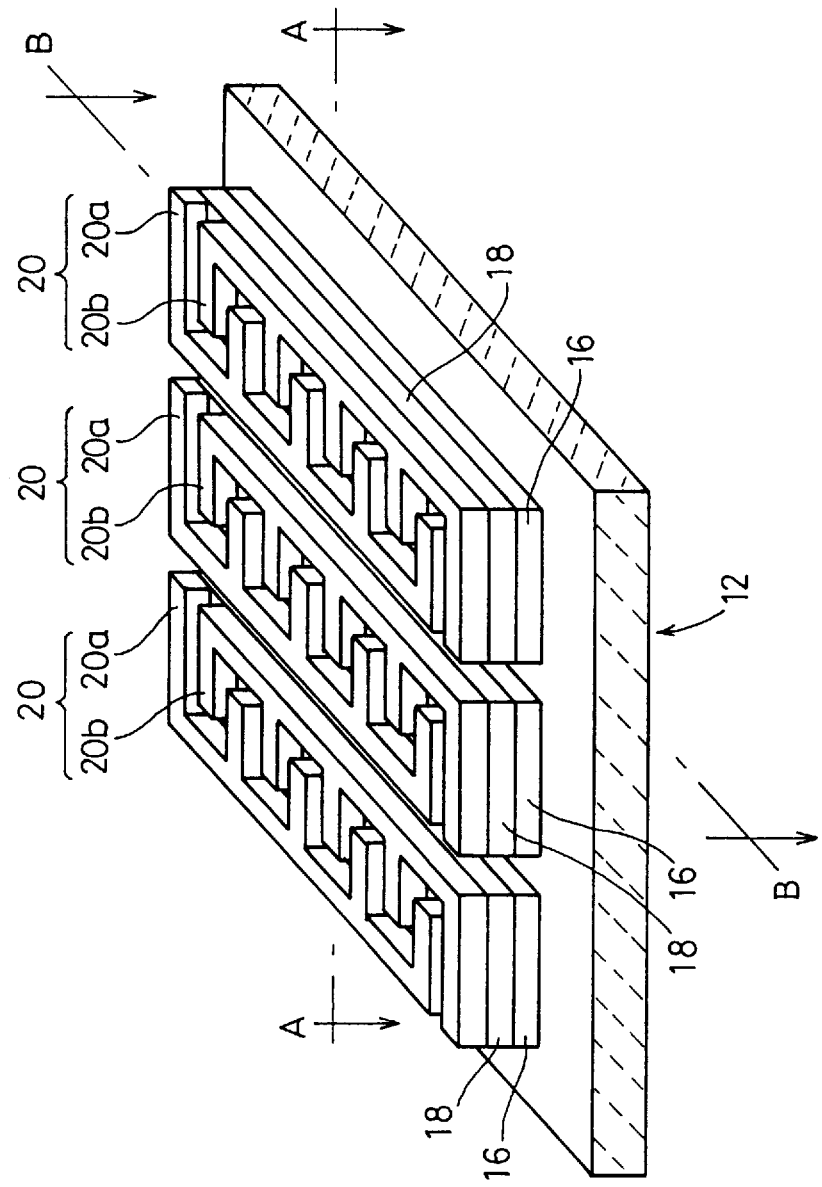
FIG. 9 shows a partial perspective view illustrating a piezoelectric film-type element according to a seventh embodiment.
Figure 10A:
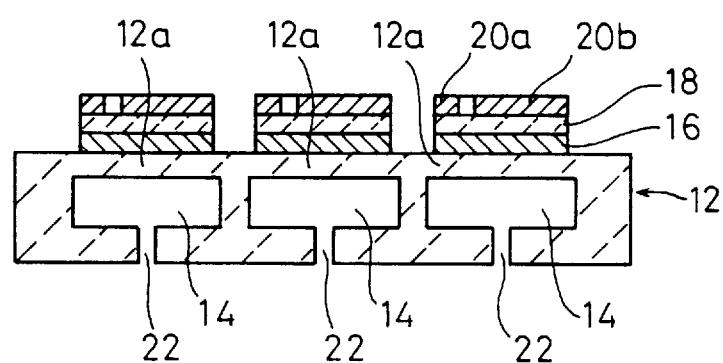
FIG. 10 shows an illustrative cross-sectional view of the piezoelectric film-type element (based on the use of a ceramic substrate that has three hollow spaces therein) shown in FIG. 9, taken along a line A—A.
FIG. 10B shows an illustrate cross-sectional view of the piezoelectric film-type element (based on the use of a ceramic substrate that has three hollow spaces therein) shown in FIG. 9, taken along a line B—B.
Figure 10B:
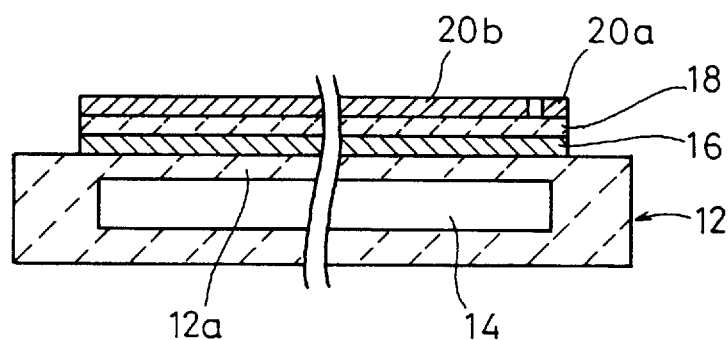

A piezoelectric film-type element according to a seventh embodiment is shown in FIGS. 9 and 10A, 10B. As clarified from the drawings, three hollow spaces 14 are formed in a ceramic substrate 12. Each of the hollow spaces 14 communicates with the outside through a communicating opening 22. A film-shaped piezoelectric operating layer constructed as shown in FIGS. 4A, 4B is integrally formed on each of outer surfaces of thin-walled sections 12a of the ceramic substrate 12, while the thin-walled sections 12a are formed by the hollow spaces 14 respectively.

Namely, each of the piezoelectric operating layers is allowed to have an integrated structure by successively forming and stacking a lower electrode 16, a piezoelectric layer 18, and an upper electrode 20. Strip electrodes 20a, 20b, which construct the upper electrode 20, are formed as comb-shaped electrodes in the same manner as the embodiment shown in FIGS. 4A, 4B respectively.

Figure 11A:
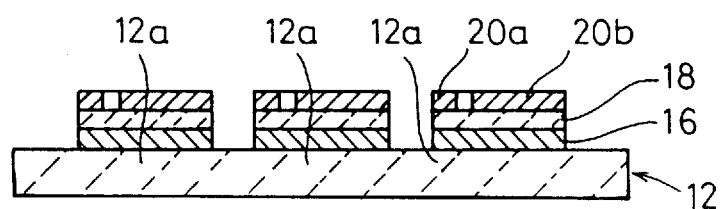
FIG. 11A shows an illustrative cross-sectional view of the piezoelectric film-type element (based on the use of a sheet of plate-shaped ceramic substrate) shown in FIG. 9, taken along a line A—A.
Figure 11B:
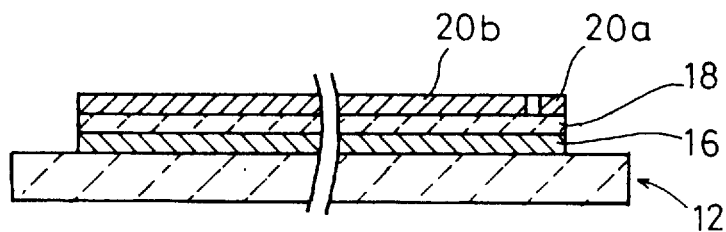
FIG. 11B shows an illustrative cross-sectional view of the piezoelectric film-type element (based on the use of a sheet of plate-shaped ceramic substrate) shown in FIG. 9, taken along a line B—B.

Alternatively, as shown in FIG. 11B, the film-shaped piezoelectric operating section may be formed, for example, on a sheet of plate-shaped ceramic substrate 12. In this arrangement, a certain function equivalent to that of the foregoing diaphragm section can be provided by supporting the plate-shaped ceramic substrate 12 by using a support member which is separately provided (not shown). In FIGS. 10A and 11A, three piezoelectric operating sections can be observed, but four piezoelectric operating sections or more may be used according to one's purpose.

Figure 12A:
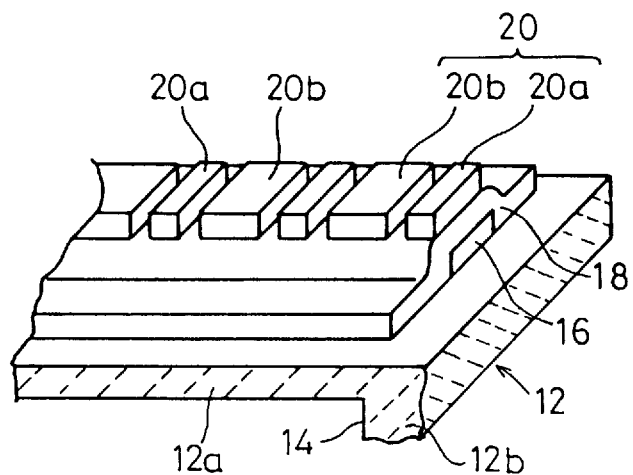
FIG. 12A shows a partial perspective view illustrating another embodiment of the piezoelectric film-type element (based on the use of a ceramic substrate having a cavity structure) according to the present invention.
Figure 12B:
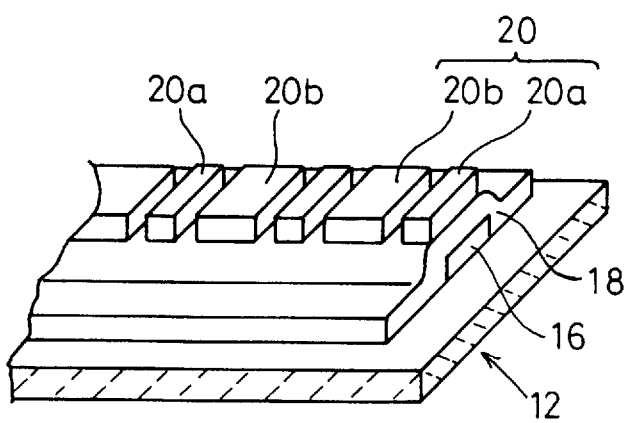
FIG. 12B shows a partial perspective view illustrating another embodiment of the piezoelectric film-type element (based on the use of a sheet of plate-shaped ceramic substrate) according to the present invention.

In the piezoelectric film-type element according to the foregoing embodiments of the present invention, any of the upper electrodes 20 each comprising the plurality of strip electrodes 20a, 20b is provided in a stripe configuration while having an identical size. However, the widths of the strip electrodes 20a, 20b may be appropriately selected. For example, as shown in FIGS. 12A, 12B, the widths of strip electrodes may be alternately changed so that the width of strip electrodes 20a is made wider than the width of strip electrodes 20b. Such an electrode structure makes it possible to easily adjust a band obtained when the present invention is applied to filter, and an amount of conversion obtained when the present invention is applied to various transducers.

Figure 13A:
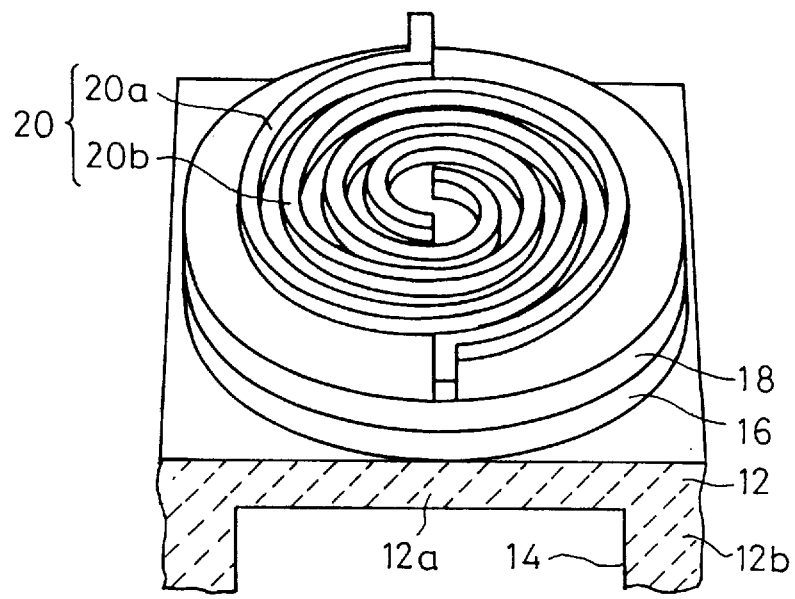
FIG. 13A shows a partial perspective view illustrating still another embodiment of the piezoelectric film-type element (based on the use of a ceramic substrate having a cavity structure) according to the present invention.
Figure 13B:
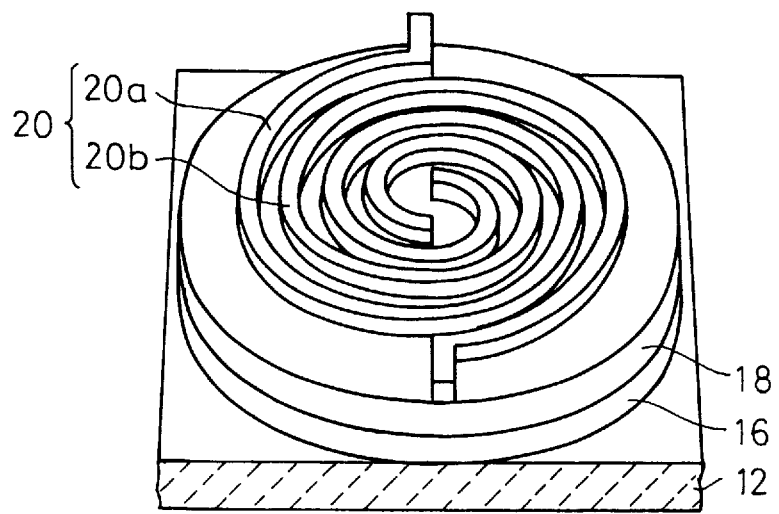
FIG. 13B shows a partial perspective view illustrating still another embodiment of the piezoelectric film-type element (based on the use of a sheet of plate-shaped ceramic substrate) according to the present invention.

The piezoelectric film-type element according to the present invention may also has a structure as shown in FIGS. 13A, 13B. Namely, an upper electrode 20 is constructed by two strip electrodes 20a, 20b each having a spiral configuration. One strip electrode 20a and the other strip electrode 20b are arranged so that they are alternately located as viewed in a direction radially outwardly from the center of the spiral.

Figure 14A:
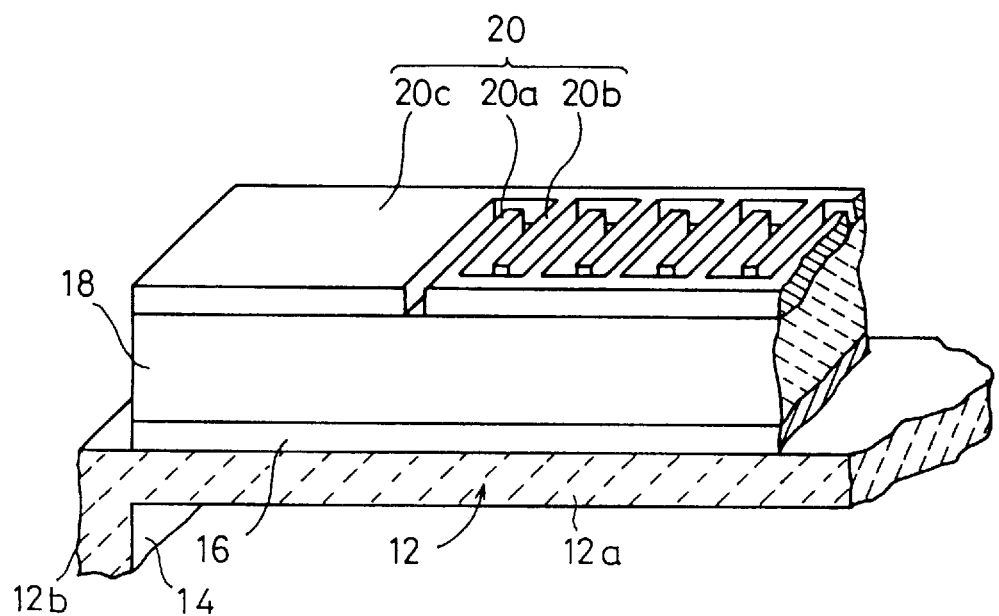
FIG. 14A shows a partial perspective view illustrating still another embodiment of the piezoelectric film-type element (based on the use of a ceramic substrate having a cavity structure) according to the present invention.
Figure 14B:
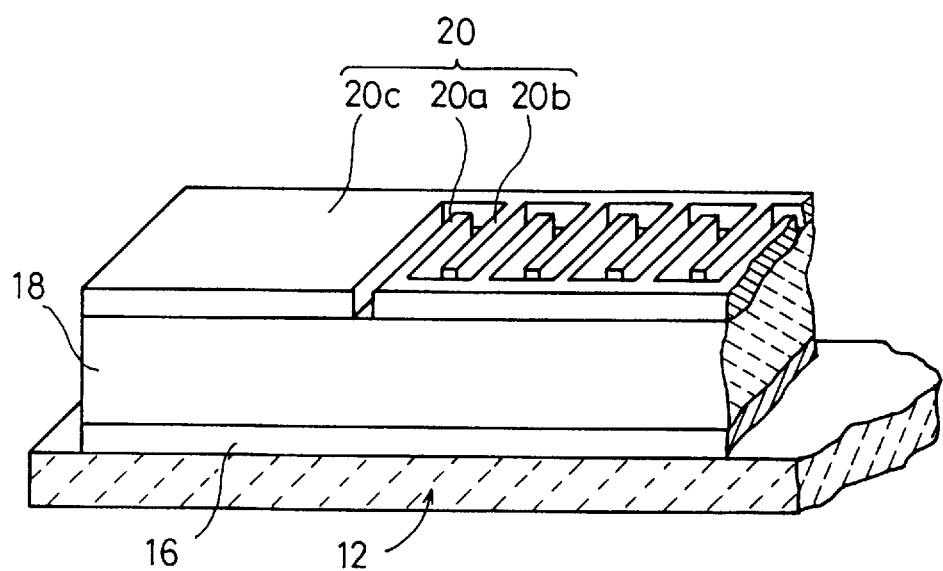
FIG. 14B shows a partial perspective view illustrating still another embodiment of the piezoelectric film-type element (based on the use of a sheet of plate-shaped ceramic substrate) according to the present invention.

The piezoelectric film-type element according to the present invention may be also constructed as shown in FIGS. 14A, 14B. Namely, a film-shaped piezoelectric operating layer is constructed such that a predetermined portion of an upper electrode 20 is constructed by a plurality of strip electrodes 20a, 20b, and the other portion of the upper electrode 20 is formed as a single flat film-shaped electrode section 20c. The piezoelectric operating layer is integrally provided on a ceramic substrate 12. In the embodiment shown in FIGS. 14A, 14B, the strip electrodes 20a, 20b are formed as comb-shaped electrodes respectively. The following advantage is obtained by adopting such a structure of the upper electrode 20. Namely, for example, when the element is used as an actuator or a vibrator, it is easy to adjust the balance among generated displacement and generated force brought about by the transverse effect of the electric field-induced strain, and generated displacement and generated force brought about by the longitudinal effect of the electric field-induced strain.

As described above, the piezoelectric film-type element according to the present invention may be embodied in a variety of forms, to which various modifications, corrections, and improvements, other than the foregoing illustrative embodiments, may be applied in a range without deviating from the spirit or essential characteristics of the present invention. It should be understood that any of them belongs to the scope of the present invention.

For example, in the foregoing embodiments, certain spaces are given between the plurality of strip electrodes 20a, 20b for constructing the upper electrode 20. However, there is no problem at all when the spaces between the strip electrodes 20a, 20b are charged with a piezoelectric material used to form the piezoelectric layer 18. Alternatively, a structure may be adopted, in which the lower electrode 16 and the upper electrode 20 are inversely located. Further alternatively, the upper electrode 20 may be provided as a single flat film-shaped electrode layer, and at least a part of the lower electrode 16 may be formed with a plurality of strip electrodes. In such an arrangement, the upper electrode 20 composed of the single flat film-shaped electrode layer corresponds to the first electrode, and the lower electrode 16 composed of the plurality of strip electrodes corresponds to the second electrode.

Specifically, the piezoelectric film-type element according to the present invention is produced as follows.

At first, materials for forming the ceramic substrate (2, 12) for constructing the piezoelectric film-type element according to the present invention will be described. Those adoptable as the material for forming the ceramic substrate (2, 12) include insulative materials and dielectric materials provided that they have a large mechanical strength, they may be subjected to a heat treatment at about 1400° C. as described later on, and they may be stacked and integrated with the piezoelectric operating layer without using any adhesive or the like. There is no problem at all even when the material is ceramic materials composed of oxide, or ceramic materials composed of those other than oxide.

In order to obtain excellent operating characteristics such as large displacement, large generated force, and quick response speed, those preferably adopted include materials containing, as a major component, at least any one of aluminum oxide, magnesium oxide, zirconium oxide, aluminum nitride, and silicon nitride, among the materials which satisfy the foregoing conditions. Especially, it is recommended to use ceramic materials containing, as a major component, aluminum oxide and/or zirconium oxide. Among them, it is especially advantageous to use a material containing, as a major component, zirconium oxide completely or partially stabilized with at least one compound selected from yttrium oxide, ytterbium oxide, cerium oxide, calcium oxide, and magnesium oxide, because of the following reason. Namely, such a material makes it possible to obtain a high toughness and a high mechanical strength even when the substrate has a thin thickness. Further, such a material undergoes a small stress upon a heat treatment together with a piezoelectric material adopted in film-forming methods. Moreover, such a material exhibits less chemical reactivity with the piezoelectric material described above.

It is preferable to add the compounds described above for stabilizing zirconium oxide, in an amount of 1 mole % to 30 mole % in the case of yttrium oxide and ytterbium oxide, in an amount of 6 mole % to 40 mole % in the case of cerium oxide, and in an amount of 5 mole % to 40 mole % in the case of calcium oxide and magnesium oxide. Especially, it is desirable to use yttrium oxide as an stabilizing agent. In this case, yttrium oxide is added desirably in an amount of not less than 1.5 mole % and not more than 6 mole %, and more preferably in an amount of not less than 2 mole % and not more than 4 mole %. When yttrium oxide is added to zirconium oxide in the foregoing range of addition, obtained zirconium oxide is allowed to have its crystal phase which is partially stabilized. Accordingly, it is possible to realize a substrate having excellent substrate characteristics.

The stabilized zirconium oxide may be added with a sintering aid such as clay, aluminum oxide, and titanium oxide. However, it is desirable to adjust the composition and the amount of addition of the sintering aid so that the substrate obtained after sintering may not contain silicon oxide ($SiO_2$, $SiO$) by not less than 1%, because of the following reason. Namely, if an excessive amount of silicon oxide is contained in the substrate, then any reaction tends to occur upon a heat treatment together with the piezoelectric material, and it becomes difficult to control the composition.

The ceramic substrate (2, 12) is finally provided in a sintered form. When the ceramic substrate (2, 12) is sintered, it is possible to use a method in which sintering is previously performed to form the substrate before the formation of the piezoelectric operating layer of the piezoelectric film-type element according to the present invention, or a method in which sintering is performed after the formation of the piezoelectric operating layer in accordance with a film-forming technique described later on by using a green sheet of a substrate material. Especially, the method, in which the ceramic substrate (2, 12) is previously sintered to form the substrate, is advantageously used because any warpage of the element can be decreased, and a necessary pattern dimensional accuracy can be obtained.

The following method is preferably adopted for producing the ceramic substrate (2, 12) having the cavity structure as shown in FIG. 1, FIG. 3A etc., from a viewpoint of high reliability. Namely, an open hole for forming the hollow space (4, 14) is formed in a green sheet by using a mold or in accordance with mechanical processing such as ultrasonic processing, or punching. A thin green sheet for producing the thin-walled section (2a, 12a) is stacked and laminated under a pressure and a heat on the green sheet provided with the open hole, followed by firing and integration.

It is desirable for the ceramic substrate (2, 12) that at least a part of the portion thereof, at which the piezoelectric operating layer of the piezoelectric film-type element according to the present invention is formed, is formed as the thin-walled section (2a, 12a). It is desirable that the thickness of the thin-walled section (2a, 12a) is generally not more than 50 $\mu$m, preferably not more than 30 $\mu$m, and more preferably not more than 15 $\mu$m, in order to obtain high speed response and large displacement of the piezoelectric film-type element.

It is desirable that the thin-walled section (2a, 12a) is generally formed to have an average grain size of crystals of 0.1 to 2 $\mu$m, more preferably an average grain size of crystals of not more than 1 $\mu$m, so that the operating characteristics of the piezoelectric operating layer provided thereon may be enhanced, and, for example, large displacement and large generated force may be obtained when the element is used, for example, as an actuator or a detecting section.

It is also desirable that a sheet of plate-shaped ceramic substrate 12, as shown in FIG. 3B, FIG. 4B etc., generally has a thickness of not more than 50 $\mu$m, preferably not more than 30 $\mu$m, and more preferably not more than 15 $\mu$m, in order to obtain quick response and large displacement of the piezoelectric film-type element.

It is desirable that at least a portion of the ceramic substrate 12 to be formed as the piezoelectric operating layer is generally constructed to have an average grain size of crystals of 0.1 to 2 $\mu$m, and more preferably the portion is constructed to have an average grain size of crystals of not more than 1 $\mu$m, so that the operating characteristics of the piezoelectric operating layer may be enhanced, and, for example, large displacement and large generated force may be obtained when the element is used, for example, as an actuator or a detecting section.

Various film-forming techniques are appropriately adopted in order to form the piezoelectric operating layer comprising the predetermined lower electrode 16, the piezoelectric layer 18, and the upper electrode 20 which are provided on at least one surface of the ceramic substrate (2, 12), as in the piezoelectric film-type element according to the present invention. Those appropriately selected include, for example, thick film-forming techniques such as screen printing, spray, dipping, and coating, and thin film-forming techniques such as ion beam, sputtering, vacuum evaporation, ion plating, CVD, and plating.

Especially, when the piezoelectric layer 18 is formed, the thick film-forming techniques are preferably adopted, based on the use of, for example, screen printing, spray, dipping, and application. According to the thick film-forming techniques, film formation can be performed on the ceramic substrate by using a paste or a slurry containing, as a major component, ceramic particles of a piezoelectric material having an average grain size of 0.01 µm to 5 µm, and preferably 0.05 µm to 3 µm. Thus good element characteristics can be obtained.

The following techniques are adopted in order to allow the film to have a desired shape. Namely, those adopted for this purpose include techniques for performing pattern formation by using, for example, screen printing methods or photolithography methods. Further, those adopted for this purpose also include techniques for performing pattern formation by removing unnecessary portions by using laser processing methods based on the use of, for example, excimer and YAG, or mechanical processing methods such as ultrasonic processing and slicing. Thus the respective shapes of the lower electrode 16, the piezoelectric layer 18, and the upper electrode 20 are realized.

The pattern formation may be performed either before or after the heat treatment described later on. It is desirable that the pattern formation is performed before the heat treatment, from viewpoints of easiness of the pattern formation and accuracy of the pattern.

The structure of the element and the shape of the film-shaped piezoelectric layer produced herein are not limited at all, for which any shape may be adopted depending on application. For example, there is no problem at all in the case of the use of polygons such as triangles and quadrangle, circular configurations such as circles, ellipses, and rings, comb-shaped configurations, lattice-shaped configurations, and special configurations obtained by combining the foregoings.

The respective films (6, 8, 10, 16, 18, 20), each of which is formed on the ceramic substrate (2, 12) in accordance with the techniques described above, may be subjected to a heat treatment every time when each of the films is formed so that an integrated structure with the substrate may be provided. Alternatively, it is also allowable to simultaneously apply a heat treatment after all of the films are formed so that the respective films are integrated to the substrate.

In some cases, the heat treatment is not necessarily required for integration when the electrode film is formed in accordance with the film-forming technique as described above. For example, before the upper electrode film (10, 20) is formed, insulative coating is occasionally applied to the circumference of the element by using, for example, an insulative resin, in order to ensure insulation between the upper electrode film (10, 20) and the lower electrode film (6, 16). In such a case, a method such as sputtering, vacuum evaporation and plating, in which no heat treatment is required, is adopted for forming the upper electrode film (10, 20).

The heat treatment is performed at a certain temperature in order to integrate the ceramic substrate and the respective films formed as described above. A temperature of about 900° C. to 1400° C. is generally adopted for the heat treatment. Preferably, a temperature in a range of 1000° C. to 1400° C. is advantageously selected. When the piezoelectric layer (8, 18) is subjected to the heat treatment, it is preferable to perform the heat treatment while controlling the atmosphere by simultaneously using a source of evaporation of a piezoelectric material so that the composition of the piezoelectric layer is not unstable during a high temperature period.

It is also recommended to adopt a method in which an appropriate covering member is placed on the piezoelectric layer (8, 18) so that its surface is not directly exposed to the firing atmosphere. The covering material, which is used in this case, is composed of a material similar to that of the substrate (for example, a material containing, as a major component, aluminum oxide, zirconium oxide, or magnesium oxide). As for a firing table (setter) which is used upon firing, it is preferable to adopt, for example, those composed of a material containing, as a major component, aluminum oxide, zirconium oxide, or magnesium oxide, in the same manner as the covering member.

The material for the lower electrode film (6, 16) for constructing the piezoelectric operating layer described above is not specifically limited provided that the material is a conductor capable of withstanding the temperature for the heat treatment and the oxidizing atmosphere at a high temperature of a degree of the firing temperature. For example, the material may be a single metal or an alloy. There is no problem at all when the material is a mixture of an insulative ceramic and a metal or an alloy, or a conductive ceramic.

More preferably, those appropriately used include high melting point noble metals such as platinum, palladium, and rhodium; electrode materials comprising, as a major component, an alloy such as silver-palladium, silver-platinum, and platinum-palladium; cermet materials composed of platinum and a ceramic substrate material; cermet materials composed of platinum and a piezoelectric material; and cermet materials composed of platinum, a substrate material, and a piezoelectric material. Especially, it is more desirable and preferable to use a material containing platinum as a major component.

If glass such as silicon oxide is used as a material to be added to the electrode, a reaction tends to occur during the heat treatment together with the piezoelectric layer (8, 18), easily making a cause of deterioration of element characteristics. Therefore, it is desirable to avoid the use of glass. The substrate material may be added to the electrode preferably by about 5 to 30% by volume, and the piezoelectric material may be added to the electrode preferably by about 5 to 20% by volume.

On the other hand, the material for forming the upper electrode (10, 20) is not specifically limited Those usable without any problem include the electrode materials described above, as well as sputtered films composed of gold, chromium, or copper, and resinate (organometallic compound) printed films composed of gold or silver.

The electrode films, which are formed by using the conductive materials as described above, are generally not more than 20 µm, and preferably not more than 5 µm. Especially, the upper electrode film (10, 20) is advantageously formed to have a thickness of not more than 1 µm, and preferably not more than 0.5 µm.

The piezoelectric film-type element according to the present invention includes the film-shaped piezoelectric operating layer comprising the lower electrode (6, 16), the piezoelectric layer (8, 18), and the upper electrode (10, 20) formed as described above, in which at least a part of any one of the lower electrode and the upper electrode is constructed as a plurality of strip electrodes to provide a stripe configuration.

The distance between the strip electrodes (10a, 10b, 20a, 20b in the illustrative embodiments) is appropriately selected. It is difficult to definitely determine the distance. However, it is effective that the distance is generally not more than 100 μm, preferably not more than 50 μm, and especially not more than 20 μm, in order to obtain large displacement at a low voltage.

The pitch of the strip electrodes (10a, 10b, 20a, 20b) is desirably not more than 200 μm, especially preferably not more than 100 μm, and especially desirably not more than 40 μm, in order to obtain large displacement at a relatively low voltage.

Any material may be adopted as the piezoelectric material for producing the piezoelectric layer (8, 18) which constructs the piezoelectric operating layer of the piezoelectric film-type element according to the present invention provided that the material exhibits the piezoelectric effect, especially the electric field-induced strain. For example, the material may be crystalline materials or amorphous materials. There is no problem at all when the material is semiconductor materials, dielectric ceramic materials, or ferroelectric ceramic materials. The material may be materials for which a polarizing treatment is necessary, or materials for which any polarizing treatment is unnecessary. Especially, according to the present invention, in the case of the piezoelectric materials for which the polarizing treatment is unnecessary are advantageously used, or in the case of the materials for which the polarizing treatment is necessary, it is advantageous to use piezoelectric materials having a polarization-inverting electric field (coercive electric field) of not more than 10 kV/cm. Thus the characteristics of the piezoelectric film-type element can be effectively expressed.

Specifically, the piezoelectric material, which is usable in the present invention, preferably includes, for example, materials containing a major component of lead zirconate titanate (PZT system), materials containing a major component of lead titanate, materials containing a major component of lead zirconate, materials containing a major component of lead magnesium niobate (PMN system), materials containing a major component of lead nickel niobate (PNN system), materials containing a major component of lead magnesium tungstate, materials containing a major component of lead manganese niobate, materials containing a major component of lead antimony stannate, materials containing a major component of lead zinc niobate, materials containing a major component of lead magnesium tantalate, materials containing a major component of lead nickel tantalate, and composite materials of the foregoing materials.

The materials described above may be added, without any problem, with additives of oxides or other types of compounds of, for example, lanthanum, barium, niobium, zinc, cerium, cadmium, chromium, cobalt, antimony, iron, yttrium, tantalum, tungsten, nickel, manganese, lithium, strontium, magnesium, calcium, and bismuth. For example, it is possible to use materials of the PLZT system obtained by adding, for example, oxide of lanthanum to materials composed of the PZT system as a major component.

Those having the coercive electric field of not more than 10 kV/cm, which are selected from the foregoing piezoelectric materials and used after adjusting components, include, for example, the PZT system, the PMN system, the mixed system of lead titanate and PMN, the PLZT system, the PBZT system obtained by adding barium to materials containing a major component of the PZT system, and the system composed of three components based on the PZT system (for example, materials containing major components of lead magnesium niobate, lead zirconate, and lead titanate, and materials containing major components of lead nickel niobate, lead titanate, and lead zirconate).

Especially, the PMN system, the PMN mixed system, the PLZT system, and the PBZT system can be used as the ic] electrostrictive material without applying any special polarizing treatment.

Among the foregoing piezoelectric materials, it is preferable to use materials containing major components of lead magnesium niobate, lead zirconate, and lead titanate, materials containing major components composed of lead nickel niobate, lead magnesium niobate, and lead titanate, materials containing major components composed of lead nickel tantalate, lead magnesium niobate, lead zirconate, and lead titanate, or materials containing major components composed of lead magnesium tantalate, lead magnesium niobate, lead zirconate and lead titanate.

Especially, it is advantageous to use materials containing major components composed of lead magnesium niobate, lead zirconate, and lead titanate, because of the following reason. Namely, these materials not only have a high piezoelectric constant, but also they exhibit especially less reactivity with the substrate material during the heat treatment.

Namely, for example, the bonding state between the ceramic substrate 12 and the protrusions of the piezoelectric layer 18 as shown in FIGS. 5A, 5B can be suppressed to be inert in such a degree that no influence is exerted on the performance necessary for the piezoelectric operating layer. Further, the segregation of components scarcely occurs, the treatment for maintaining the composition can be appropriately performed, and it is easy to obtain an objective composition and an objective crystal structure. Therefore, the foregoing materials are recommended as materials for forming the piezoelectric layer in accordance with the thick film-forming techniques such as screen printing, spray, dipping, and application.

When the piezoelectric material of the multicomponent system is used, the piezoelectric characteristics change depending on the composition of components. However, it is preferable to use a composition in the vicinity of the boundary of phases of pseudo-cubic crystal-tetragonal crystal-rhombohedral crystal, in the case of the material of the three component system of lead magnesium niobate-lead zirconate-lead titanate which is preferably adopted for the piezoelectric film-type element according to the present invention. Especially, it is advantageous to adopt a composition comprising lead magnesium niobate: 15 mole % to 50 mole %, lead zirconate: 10 mole % to 45 mole %, and lead titanate: 30 mole % to 45 mole %, because of its high piezoelectric constant and its high electromechanical coupling factor.

It is desirable that the piezoelectric layer (8, 18) formed by using the piezoelectric material described above generally has a thickness of not more than 100 μm, preferably not more than 50 μm, and more preferably about 3 μm to 40 μm, in order to obtain, for example, large displacement at a relatively low operating voltage. The film-shaped piezoelectric operating layer, which comprises the lower electrode (6, 16) and the upper electrode (10, 20) in addition to the piezoelectric layer (8, 18), generally has a thickness of not more than 150 μm, and preferably not more than 50 μm.

It is more effective to consider the electric field in the vicinity of the lower conductor film (6, 16) which is not utilized as an electrode when the second piezoelectric operating means is operated. Accordingly, it is desirable to appropriately control the ratio of the thickness X of the piezoelectric layer (8, 18) described above (see FIG. 1A) to the distance Y between the strip-shaped upper electrodes (see FIG. 1A). Preferably, the ratio X/Y of the thickness X of the piezoelectric layer to the distance Y between the upper strip electrodes is in the following range:

$$0.3 \leq X/Y \leq 6$$

Further, it is desirable to operate the element by appropriately controlling the electric signal applied to each of the piezoelectric operating means, depending on the thickness of the piezoelectric layer 18 and the distance between the electrodes.

In the foregoing embodiments of the piezoelectric film-type element (based on the use of a ceramic substrate having a cavity structure) according to the present invention, a part of the film-shaped piezoelectric operating section overlaps a part of the thick-walled section of the ceramic substrate 12. Alternatively, for example, as represented by and shown in FIG. 15 it is allowable to form the film-shaped piezoelectric operating section only on the thin-walled section 12a.

The piezoelectric film-type element according to the present invention obtained as described above is applicable to uni-morph type elements and bi-morph type elements used for those which convert electric energy into mechanical energy, i.e., convert electric energy into mechanical displacement, force, and vibration, or which perform conversion reversely thereto, including, for example, various transducers, various actuators, frequency functional components (filter, etcd.), various display devices (displays), transformers, microphones, sounding bodies (speakers or the like), vibrators, resonators, and oscillators for communication and power generation, discriminators, various sensors such as ultrasonic sensors, acceleration sensors, angular velocity sensors, and shock sensors, and gyroscopes, as well as servo displacement elements, pulse driving motors, ultrasonic motors, piezoelectric fans, and piezoelectric relays as described by Kenji Uchino in "Piezoelectric/electrostrictive actuators: from the basic to application" (edited by Japan Industrial Technology Center, published by Morikita-Syuppan). Preferably, the piezoelectric film-type element according to the present invention is advantageously adopted, for example, for various actuators, vibrators, sounding bodies, and display devices.

The piezoelectric film-type element according to the present invention also possesses dielectric properties in addition to the piezoelectric characteristics (including the electrostrictive characteristics). Accordingly, the piezoelectric film-type element can be also utilized as a film-shaped capacitor element. When a material also having ferroelectric properties is used as the piezoelectric material, the piezoelectric film-type element can be also utilized as an electron-emission element.

As clarified from the foregoing description, according to the present invention, the first and second piezoelectric operating means are constructed by utilizing the single piezoelectric layer. The entire operation of the piezoelectric film-type element is exhibited in a form of combination of the operations of the two piezoelectric operating means. Accordingly, the piezoelectric effects are sufficiently utilized, and the element characteristics of the piezoelectric film-type element are remarkably improved as compared with the case based on the use of the conventional single piezoelectric operating means. As a result, the realized piezoelectric film-type element has excellent functions, which is allowed to have a compact shape, and which can be operated at a low voltage.

Especially, when the piezoelectric film-type element according to the present invention is used as a displacement element for actuators and vibrators, it is possible to remarkably increase the amplitude of displacement, the amplitude of vibration, and the force by utilizing the piezoelectric effects, especially the transverse effect and the longitudinal effect of the electric field-induced strain. Thus it is possible to realize remarkably improved displacement characteristics, vibration characteristics, and force characteristics.

The piezoelectric film-type element according to the present invention has been specifically explained on the basis of the several embodiments. However, the present invention should not be limited to and should not be interpreted on the basis of the foregoing embodiments. It should be understood that various changes, corrections, and modifications can be applied on the basis of the knowledge of those skilled in the art without deviating from the gist or essential characteristics of the present invention.

What is claimed is:

1. A piezoelectric film-type element, comprising:
   a ceramic substrate;
   a piezoelectric operating layer disposed on at least one surface of said ceramic substrate, said piezoelectric operating layer comprising a single piezoelectric layer having first and second electrodes arranged integrally on both sides, in a thickness direction thereof, said first electrode comprising a single electrode layer and said second electrode comprising a plurality of strip electrodes; and
   means for employing at least one of (i) said first and second electrodes, respectively, each having opposite polarity with respect to the other and (ii) individual strip electrodes of said second electrode, said individual strip electrodes having opposite polarities with respect to each other,
   wherein said piezoelectric operating layer is operable as a first piezoelectric operating means operable via said first and second electrodes and said piezoelectric layer, and said piezoelectric operating layer is operable as a second piezoelectric operating means operable via said piezoelectric layer and said plurality of strip electrodes of said second electrode only.

2. The piezoelectric film-type element according to claim 1, wherein said piezoelectric layer is formed of a piezoelectric material having a coercive electric field of not more than 10 kV/cm.

3. The piezoelectric film-type element according to claim 1, wherein said ceramic substrate is formed as a thin-walled diaphragm section, and said piezoelectric operating layer is integrally formed on an outer surface of said diaphragm section.

4. The piezoelectric film-type element according to claim 3, wherein said diaphragm section has a thickness of not more than 50 μm.

5. The piezoelectric film-type element according to claim 3, wherein crystals for constructing said diaphragm section of said ceramic substrate has an average grain size of 0.1 to 2 μm.

6. The piezoelectric film-type element according to claim 1, wherein:
   said ceramic substrate has at least one hollow space;
   a portion of said ceramic substrate to give a wall section for comparting said hollow space from the outside is formed as a thin-walled diaphragm section; and
   said piezoelectric operating layer is integrally formed on an outer surface of said diaphragm section.

7. The piezoelectric film-type element according to claim 6, wherein said diaphragm section has a thickness of not more than 50 μm.

8. The piezoelectric film-type element according to claim 6, wherein crystals for constructing at least said diaphragm section of said ceramic substrate have an average grain size of 0.1 to 2 μm.

9. The piezoelectric film-type element according to claim 1, wherein said plurality of strip electrodes are divided into two different sets each comprising alternate strip electrodes so that each of said alternate strip electrodes is connected to one another at one of both ends in a longitudinal direction respectively to construct two comb-shaped electrodes.

10. The piezoelectric film-type element according to claim 1, wherein said ceramic substrate is composed of a material containing, as a major component, completely stabilized or partially stabilized zirconium oxide.

11. The piezoelectric film-type element according to claim 1, wherein said piezoelectric layer has a thickness of not more than 100 μm.

12. The piezoelectric film-type element according to claim 1, wherein said piezoelectric operating layer has a thickness of not more than 150 μm.

13. The piezoelectric film-type element according to claim 1, wherein the following relation is satisfied:

$$0.3 \leq X/Y \leq 6$$

provided that a thickness of said piezoelectric layer is X, and a distance between said plurality of strip electrodes is Y.

14. A method of operating a piezoelectric film-type element, comprising the steps of:

providing a piezoelectric film-type element comprising a ceramic substrate;
a piezoelectric operating layer disposed on at least one surface of said ceramic substrate, said piezoelectric operating layer comprising a single piezoelectric layer having first and second electrodes arranged integrally on both sides, in a thickness direction thereof, said first electrode comprising a single electrode layer and said second electrode comprising a plurality of strip electrodes; and employing at least one of (i) said first and second electrodes, respectively, which have opposite polarity with respect to each other, to operate said piezoelectric operating layer as a first piezoelectric operating means operable via said first and second electrodes and said piezoelectric layer and (ii) individual strip electrodes only of said second electrode, said individual strip electrodes having opposite polarities with respect to each other, to operate said piezoelectric operating layer as a second piezoelectric operating means operable via said piezoelectric layer and said plurality of strip electrodes of said second electrode only, and wherein said first and second piezoelectric operating means are commonly or separately operable.

* * * * *